United States Patent
Schneidewind et al.

(10) Patent No.: US 7,046,025 B2
(45) Date of Patent: May 16, 2006

(54) TEST APPARATUS FOR TESTING SUBSTRATES AT LOW TEMPERATURES

(75) Inventors: Stefan Schneidewind, Reichenberg (DE); Claus Dietrich, Sacka (DE); Jorg Kiesewetter, Dresden (DE); Frank-Michael Werner, Dresden (DE); Axel Schmidt, Stolpchen (DE); Matthias Zieger, Riesa (DE)

(73) Assignee: SUSS MicroTec Testsystems GmbH, Saca bei Dresden (DE)

( * ) Notice: Subject to any disclaimer, the term of this patent is extended or adjusted under 35 U.S.C. 154(b) by 0 days.

(21) Appl. No.: 10/677,178

(22) Filed: Oct. 2, 2003

(65) Prior Publication Data

US 2004/0070415 A1  Apr. 15, 2004

(30) Foreign Application Priority Data

Oct. 2, 2002  (DE)  ................................ 102 46 232
Oct. 2, 2002  (DE)  ................................ 102 46 282

(51) Int. Cl.
  *G01R 31/02*  (2006.01)
(52) U.S. Cl. ..................................................... 324/760
(58) Field of Classification Search ................ 324/754, 324/755, 760, 765; 219/405, 411, 390; 392/407, 392/416, 418; 165/80.2, 80.3
See application file for complete search history.

(56) References Cited

U.S. PATENT DOCUMENTS

| | | | |
|---|---|---|---|
| 4,692,694 A * | 9/1987 | Yokoi et al. ................. 324/760 |
| 5,266,889 A * | 11/1993 | Harwood et al. ............ 324/754 |
| 5,775,416 A * | 7/1998 | Heimanson et al. ......... 165/275 |
| 5,930,456 A * | 7/1999 | Vosen .......................... 392/416 |
| 6,169,409 B1 * | 1/2001 | Amemiya .................... 324/754 |
| 6,194,907 B1 * | 2/2001 | Kanao et al. ................ 324/760 |
| 6,198,299 B1 * | 3/2001 | Hollman ...................... 324/758 |
| 6,222,990 B1 * | 4/2001 | Guardado et al. ........... 392/416 |
| 6,344,750 B1 * | 2/2002 | Lo et al. ...................... 324/751 |
| 6,538,440 B1 * | 3/2003 | Dean et al. .................. 324/318 |
| 6,735,378 B1 * | 5/2004 | Kellerman et al. ......... 392/416 |
| 6,771,895 B1 * | 8/2004 | Gat et al. .................... 392/416 |

* cited by examiner

*Primary Examiner*—Jermele Hollington
(74) *Attorney, Agent, or Firm*—Baker Botts LLP

(57) ABSTRACT

A test apparatuss for testing substrates at low temperatures has a chuck, which can be displaced in the working area by means of a chuck drive, the temperature of which can be controlled using heating and cooling means. The chuck has a receiving surface for receiving a test substrate and holding means for fixing a substrate carrier which receives the test substrate. Spatially and thermally defined test conditions are maintained with minimal energy and labor costs both at room temperatures and at low temperatures. This is achieved by providing a vacuum chamber which surrounds the working area of the chuck. The chuck is on one side thermally decoupled from the uncooled chuck drive and on the other side is thermally connected in a releasable manner to the test substrate. The cooled chuck and the cooled test substrate are shielded from the thermal radiation of the surrounding uncooled assemblies by means of a directly cooled thermal radiation shield.

10 Claims, 3 Drawing Sheets

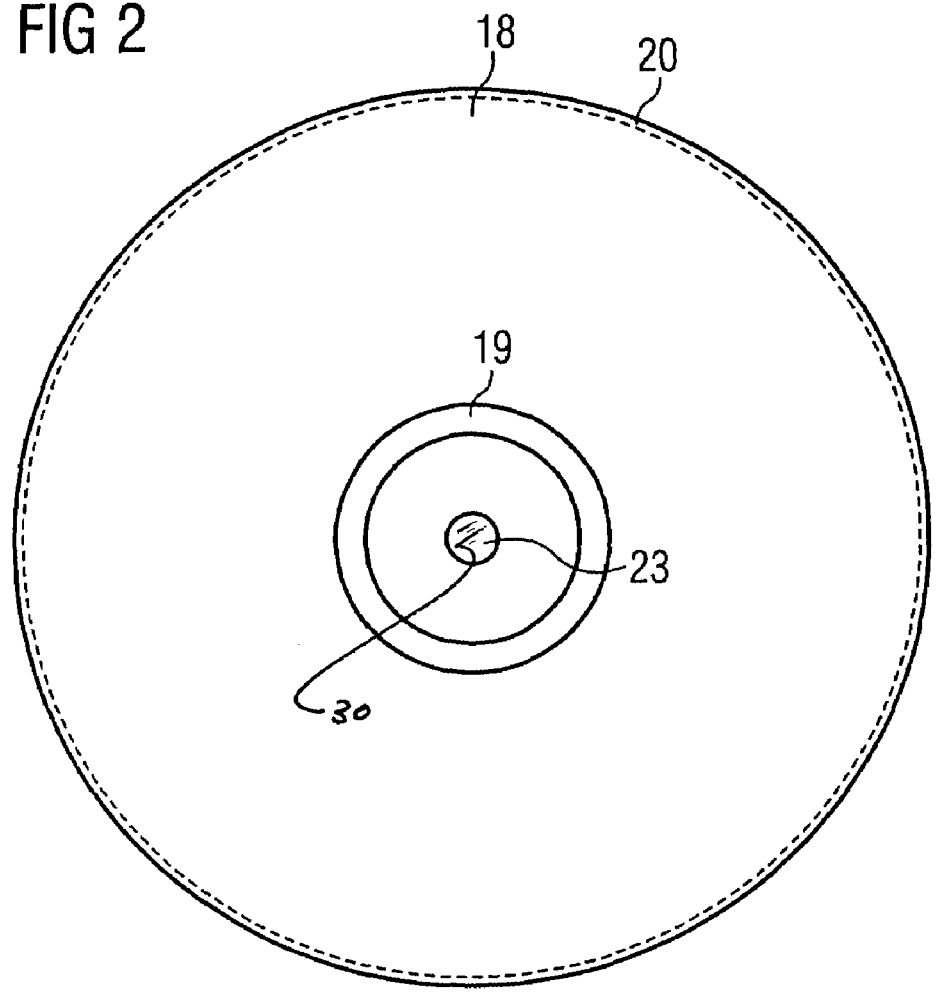
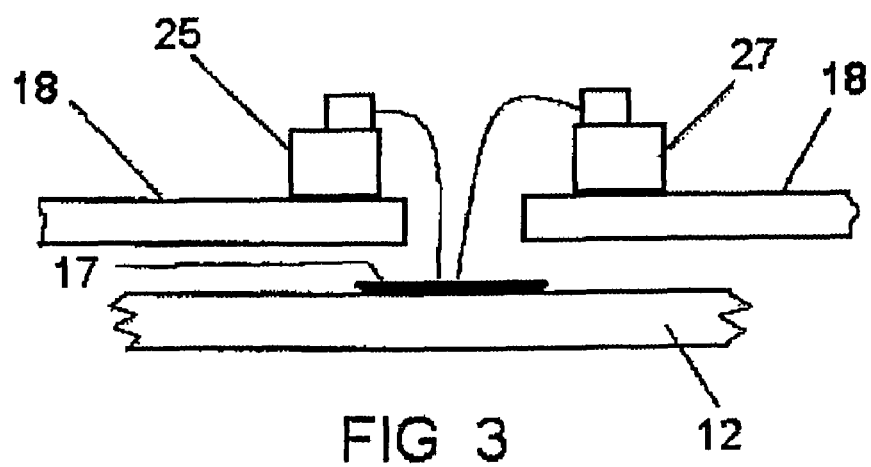

TEST APPARATUS FOR TESTING SUBSTRATES AT LOW TEMPERATURES

BACKGROUND OF THE INVENTION

This application is related to the subject matter of commonly owned, co-pending application Ser. No. 10/677,524, filed on even date herewith, the specification of which is incorporated herein by reference.

The invention relates to a test apparatus for testing substrates at low temperatures, having a chuck, which can be displaced in the working area by means of a chuck drive and can be cooled using suitable cooling apparatus. The test apparatus includes a receiving surface for receiving a test substrate, comprising a substrate carrier and component to be tested, and a holding arrangement for receiving the substrate carrier.

The test substrate may comprise either semiconductor chips which are still joined to the wafer, or individual components, such as semiconductor chips, hybrid components, micromechanical components or the like. The substrate has a smooth and planar underside and is arranged and held, at least indirectly, on the chuck, which has a smooth and planar receiving surface. The test substrate can be displaced with the chuck in the working area by means of a chuck drive, so that it can be positioned in relation to the contact-making needles. Positioning in the horizontal plane is generally effected by an X-Y table, which also an orientation angle adjustment in the range of a few degrees.

The operational reliability of electronic components is preferably tested under the environmental conditions which correspond to the conditions of use of the component in question. In this context, testing at temperatures below the freezing point of water is a focal point.

To set these test conditions, the working area of the test apparatus is generally surrounded by an enclosure. A test apparatus having a housing of this type is known from DE 4109908 C2. In the case of this test apparatus, the enclosure has a plurality of inlet openings in the lower section and a further opening, which serves both as an outlet opening and to provide test probe access in the upper wall of the enclosure. When testing in the relatively low-temperature range, a gas flow is provided through the working area by means of these openings, in order to prevent the precipitation of moisture from the surrounding atmosphere on the test substrate. However, these test conditions restrict the possible low temperature range for the testing of electronic components.

In addition to receiving and positioning the test substrate, the chuck is also used to set the temperature at which the testing of the test substrate is to take place. For this purpose, a suitable coolant is applied to the chuck. To set the temperature or further controlled test conditions at the chuck, the latter is connected, via fluid lines, to the corresponding coolant source located outside the working area. On account of heat exchange with the chuck drive, which is in thermal contact with the chuck, the chuck drive is likewise cooled. In the test apparatus described, the cooled chuck drive constitutes a particular drawback, since the positioning of the chuck relative to the probes can only be effected with the reproducibility and accuracy required for the test substrate with considerable outlay on time and labor. The media connections and lines, which are relatively rigid at relatively low temperatures, further exacerbate this drawback.

A further drawback consists in the fact that the temperature of the test substrate is influenced by the surrounding components of the test apparatus, the temperature of which has been set very differently by the various heat exchange processes in the equilibrium state. For example, high levels of heat are introduced into the test substrate as a result of uncontrollable thermal radiation and convection from the surrounding hot components, which has a significant adverse effect on the accuracy and reproducibility of the testing.

For the testing to be carried out, the test substrate has test probes applied to it, in the form of contact-making needles with electrical input signals, and the output signals are measured using additional probes. The output signals may be of various types and may also be produced by other input variables, such as for example radiation in different wavelength regions. The probes are generally located outside the working area, on the upper housing closure, and make contact with the components through the above-described opening located in the top of the housing, either directly or indirectly via contact-making surfaces which are present on the test substrate. When the components are being tested at relatively low temperatures, the fact that the probes are at room temperature firstly means that the geometry of the probes does not coincide with the geometry of the test substrates in the cooled state. Secondly, the contact between the test substrate and the warmer probes leads to a temperature drift at the substrate and therefore to a change in the test conditions. These facts also have a significant adverse effect on the accuracy and reproducibility of the testing at relatively low temperatures.

Accordingly, the invention is based on the object of providing a test apparatus for testing substrates at low temperatures in which spatially and thermally defined test conditions can be set and maintained with minimal outlay on energy and labor both at room temperatures and at low temperatures.

SUMMARY OF THE INVENTION

According to the invention, the object is achieved by virtue of the fact that there is a vacuum chamber which surrounds the working area of the chuck and is connected to a vacuum pump, and that one side of the chuck is thermally decoupled from the uncooled chuck drive and the other side of the chuck is thermally connected in a releasable manner to the test substrate. The test substrate is shielded from the thermal radiation of the surrounding uncooled assemblies by means of a directly cooled thermal radiation shield. The production of a vacuum in the working area makes it possible to test more components than were described in the introduction. In particular, it is now possible to test the oscillation behavior of micromechanical components or optical switches, since the presence of immobile and moving gases in the test environment influences the oscillation behavior of the components themselves or causes oscillations in the test atmosphere to be superimposed on the test variable.

The thermal decoupling of the chuck drive from the cooled chuck allows a motorized X-Y table to be used as a chuck drive, even at very low temperatures. Consequently, the chuck drive can be controlled very easily by an operating element outside the vacuum chamber, and the mobility of the X-Y table is not restricted by the low temperature of the moving parts. Furthermore, the stepper motors of the X-Y table allow the chuck to be positioned with an accuracy and reproducibility of a few micrometers without problems despite the presence of rigid coolant lines.

Furthermore, the thermal decoupling of the chuck, together with a reduction in the number of components to be cooled, leads to an increase in the stability and accuracy of the temperature regime and to a reduction in the coolant consumption. By virtue of the fact that heat exchange with the environment through convection is prevented, in particular the production of a vacuum in the working area accelerates the cooling process.

Testing of the components at low temperatures under vacuum conditions is particularly advantageous, since in vacuo no moisture, which would otherwise distort the test results or prevent testing altogether, is precipitated on the test substrate. The precipitation of moisture during evacuation is prevented by a suitable dry working gas being introduced into the vacuum chamber beforehand.

Optimum cooling of the test substrate is achieved by virtue of the fact that the substrate is provided with a planar, smooth underside and rests on the chuck over its entire surface, the chuck likewise having a planar, smooth receiving surface, and a non-positive connection being produced between these two surfaces by suitable holding means, in such a manner that this connection can be released for the purpose of mounting the test substrate on the chuck.

To reduce the introduction of heat at the chuck and at the test substrate from the warmer surrounding components of the test apparatus via thermal radiation, these components are shielded by a thermal radiation shield. It is expedient for the thermal radiation shield to be cooled directly to the chuck temperature by the application of the coolant which is in each case being used.

The cooling of the chuck and the thermal radiation shield can take place in various ways in the cooling regime, depending on the requirements and optimal conditions of the testing process. By way of example, the testing process can be shortened if the chuck and the test substrate are cooled first of all, and then the thermal radiation shield is cooled, since in this way the testing of the components can be commenced even before the final temperature of the thermal radiation shield is reached. Precipitation of moisture on the test substrate is avoided by virtue of the fact that dry nitrogen is admitted before the vacuum chamber is evacuated. If the thermal radiation shield is cooled first of all, followed by the chuck with the test substrate, any moisture which may be present will precipitate on the thermal radiation shield rather than on the substrate, so that the testing is not influenced. The simultaneous cooling of the chuck and the thermal radiation shield not only prevents the precipitation of moisture but also prevents any distortion from occurring in the test assembly, which significantly improves the accuracy of positioning of the test probes.

In one expedient configuration of the invention, the vacuum chamber is provided with an inspection opening on the top side lying opposite the top side of the chuck. This makes it possible to observe on the one hand the test operation and on the other hand the positioning, which is important in particular when testing individual components.

The thermal decoupling of the chuck is achieved in particular by virtue of the fact that, according to an advantageous embodiment of the invention, the chuck is connected to the X-Y table by means of an intermediate part made from a material with a lower thermal conductivity than metal. Decoupling of this nature causes the temperature of the chuck and therefore of the test substrate to follow the boiling point of the coolant with a high level of accuracy and stability, since apart from the test substrate no further parts are cooled indirectly.

According to a further embodiment of the invention, the thermal radiation shield has a through-opening in the center. This, like the inspection opening in the vacuum chamber, allows the positioning and testing of the test substrate to be observed. Furthermore, it is possible to arrange the probe holders above the thermal radiation shield and for the probes to be brought into contact with the test substrate through this opening.

It is also possible for this through-opening to be provided with a transparent closure which filters light of selected wavelengths. This has the advantage of enabling further components to be tested, such as in particular sensors for radiation of this defined wavelength. The filter makes it possible to prevent the testing from being influenced by precisely this background radiation.

In one expedient refinement of the invention, the test substrate is provided with probe holders for individual and multiple probes, which are thermally conductively connected to the chuck. This causes the temperature of the probes to track the chuck temperature and eliminates the need for readjustment of the probes in the cooled state, since the positioning of the individual probes relative to the components and the distances between the multiple probes, which are matched to the distances between the components on the test substrate, do not change or only change slightly during cooling. Furthermore, the introduction of heat by the warmer probes and therefore the temperature drift at the component are prevented.

In the case of various geometries of the test substrate, it is expedient for the probe holders not to be directly connected to the test substrate itself. Therefore, in a further configuration of the invention, the thermal radiation shield is at least indirectly provided with the probe holders for individual or multiple probes in such a manner that these probes are thermally conductively connected to the thermal radiation shield. Since, as described, the thermal radiation shield is cooled directly by the application of coolant, in this embodiment too, the temperature of the probes tracks that of the test substrate. There is no need for readjustment, as would be necessary as a result of thermally induced changes in the test substrate and probe geometries and the above-described temperature drift of the component.

In an advantageous configuration of the invention, the holding arrangement for the substrate carrier has a vertically movable head, which is thermally connected to the cooled chuck in the part close to the substrate, and a holding pin which is fixed to the X-Y table. The holding pin consists of a material with a lower thermal conductivity than metal.

Forming the holding arrangement from two parts, the head and the holding pin, firstly allows the heads to be cooled indirectly via the cooled chuck, on account of the use of a material of good thermal conductivity for these heads, and secondly allows the chuck to be thermally decoupled from the X-Y table. The heads engage releasably, in a vertically fixing manner, in suitable holding members on the test substrate and as a result are in thermal contact with the test substrate. They are connected to the holding pins, which are secured to the X-Y table under spring force, so that a vertical relative movement of the chuck can be utilized to produce or release a nonpositive connection between the test substrate and the chuck. On account of the fact that the holding pins are secured to the X-Y table, they follow the movements of the test substrate held on the receiving surface of the chuck.

According to a further advantageous embodiment of the invention, the chuck comprises a chuck body with a chuck surface and a chuck plate which rests on the chuck surface over its entire area and can be released from the chuck body. This means that the releasable chuck plate can be removed from the vacuum chamber in order for the test substrate to be mounted on the chuck. The chuck plate is connected to the chuck body in the same way as that described above, via the thermally decoupling holding pins and heads, with the corresponding holding means in this case being present not on the test substrate but rather on the chuck plate.

If, in a particular embodiment of the invention, the directly and indirectly cooled parts of the chuck and of the thermal radiation shield consist of material with a good thermal conductivity, and the cooled parts of the chuck have highly reflective surfaces, heat exchange with the surrounding, warmer components through thermal radiation is minimized and heat exchange with the parts to be cooled by heat conduction is optimized. The use of a material with good thermal conductivity and a matt surface for the thermal radiation shield ensures optimum dissipation of the thermal energy which has been absorbed by the thermal radiation shield.

In a further configuration of the invention, the chuck has a heater on its underside, so that different temperatures than those of the boiling point of the coolant used in each case can be set. It is also possible to accelerate the process of heating up the cooled chuck, for example in order for the test arrangement to be changed.

To enable the thermal radiation shield to be incorporated in the temperature regime of a heatable chuck, in a further configuration of the invention the thermal radiation shield likewise has a heater.

The invention is to be explained in more detail below with reference to an exemplary embodiment.

BRIEF DESCRIPTION OF THE DRAWINGS

FIG. 2 shows a plan view of the thermal radiation shield.
FIG. 3 is a cross-sectional partial view showing an alternate arrangement for the probe holders.

DETAILED DESCRIPTION OF THE INVENTION

Figure 1:
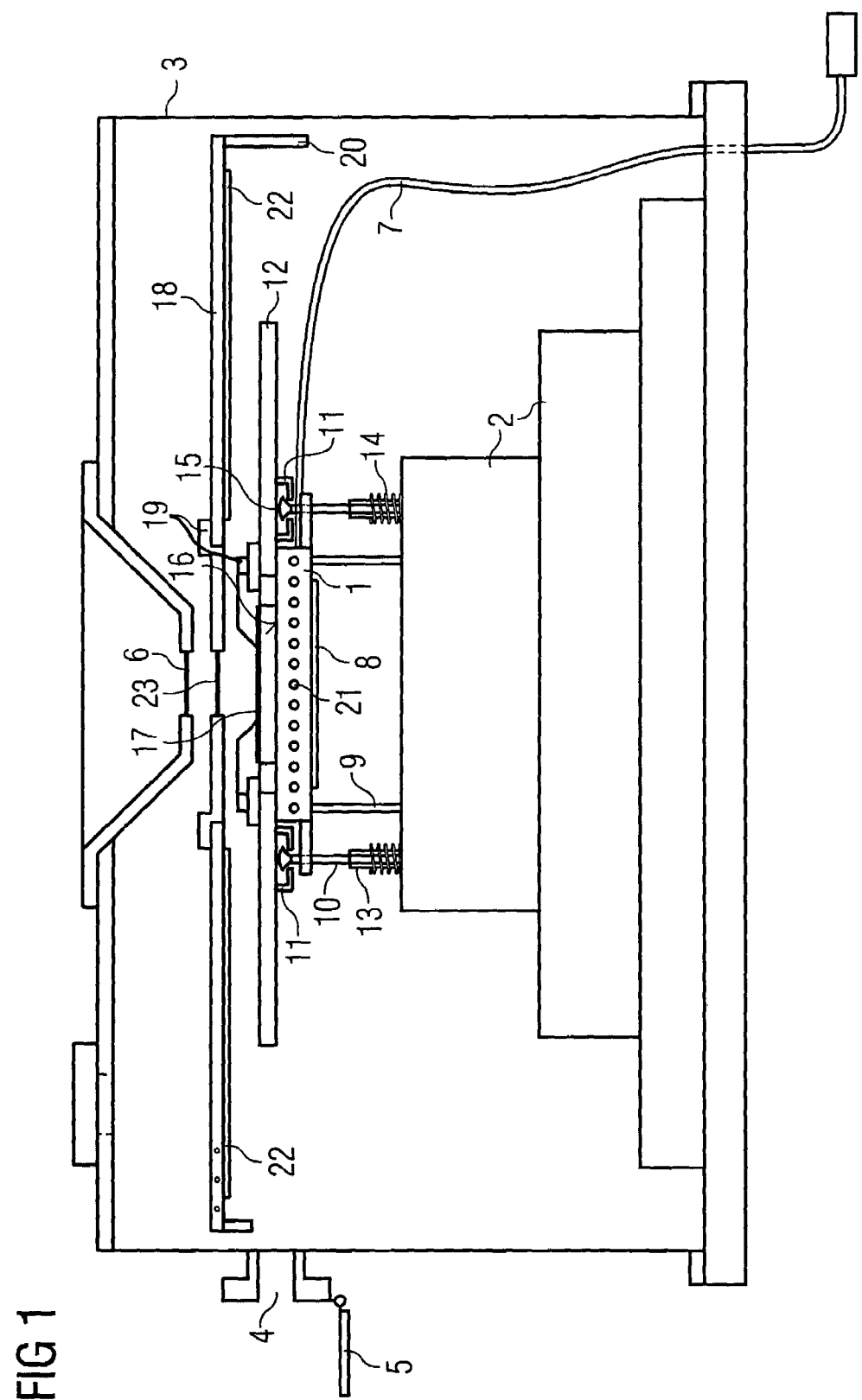
FIG. 1 shows a sectional view through a test apparatus according to the invention.

As illustrated in FIG. 1, a test apparatus for low-temperature testing, known as a cryotest apparatus, has a chuck 1, which is connected to a chuck drive 2, preferably a motorized X-Y table. The chuck 1 can be displaced in the working area by means of the chuck drive 2. The working area is surrounded by a vacuum chamber 3, which on one side has a loading opening 4, which can be closed off in a vacuum-tight manner by a flap 5, and centrally above the working area has an inspection opening 6, which is closed off by quartz glass which reflects infrared radiation. The working area is connected to a vacuum unit for evacuating the working area.

The cylindrical chuck 1 consists of copper with a gold coating, is connected to a coolant tank via the flexible coolant line 7, and, depending on the coolant used, can be cooled to various temperature ranges as a result of the coolant being passed through passages 21 which are present in the interior of the chuck 1. The underside of the chuck 1 has a chuck heater 8.

The chuck 1 is secured to the chuck drive 2 by means of an intermediate part 9 comprising a glass fiber tube which has a slightly smaller cross section than the chuck 1 and a wall thickness of approx. 1 mm.

Four first, mushroom-shaped holding rods 10 are secured to the chuck 1 in such a way that they can execute small vertical movements and engage into second, groove-like holding members 11 on the substrate carrier 12. The groove-like holding members 11 enable the substrate carrier to be inserted through an opening 4 of the vacuum chamber with the substrate and possibly the probe holders 19 attached thereto. Rods 10 are fixed to the chuck drive 2 via a holding pin 13 made from polymer fiber material and are held in a lower position by springs 14. As a result of the heads 15 of the first holding rods 10 engaging into the second holding member 11, the first holding rods 10 are pulled by the second holding members 11 out of their lower position into an upper position, in which they are held by the second holding member 11, SO that the force of the springs 14 produces a defined clamping action onto the substrate carrier 12 and good thermal contact is produced between the receiving surface 16 of the chuck 1 and the underside of the substrate carrier 12 and test substrate 17 held by the substrate carrier 12.

A disk-like thermal radiation shield 18 with a ring-like flanged edge 20 which is angled off downward and a probe holder 19 is arranged a short distance above the test substrate 17. The thermal radiation shield 18, like the chuck 1, is connected to a coolant tank via a flexible coolant line 7 and is cooled as a result of the coolant being passed through passages 21 which are present in the interior of the thermal radiation shield 18. The thermal radiation shield is made from material with a very good thermal conductivity and a highly reflective surface. As with the chuck 1 a shield heater 22 is arranged on the thermal radiation shield 18.

The temperature required to test the test substrate 17 is controlled both at the chuck 1 and at the thermal radiation shield 18 by means of a measuring and control unit. The probe holder 19 forms the middle part of the thermal radiation shield and consists of heat-storing material of very good thermal conductivity. A circular through-opening 23 is arranged in the center, accurately beneath the inspection opening in the vacuum chamber. This through-opening 23 is closed off by a transparent closure 30, such as a glass, which reflects infrared radiation.

FIG. 3 is a cross-sectional view showing an alternate arrangement of the probe holders 25, 27 mounted on the heat shield 18 and connecting to substrate 17, which is mounted on substrate carrier 12. The probe wires pass through a central opening in heat shield 18.

Figure 4:
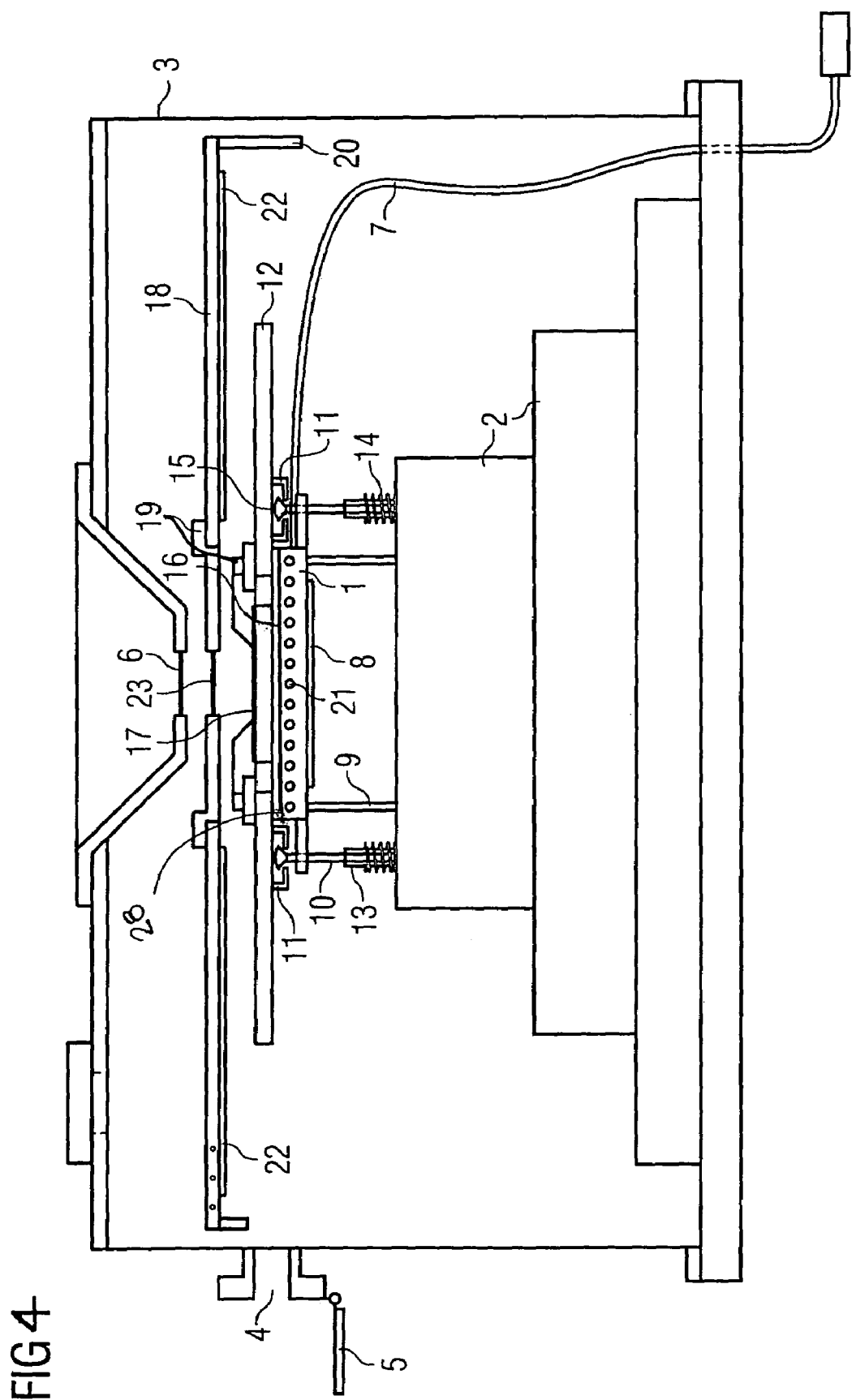
FIG. 4 is a sectional view through an alternate embodiment of a test apparatus according the invention.

FIG. 4 illustrates a further alternate embodiment of the invention, in which the chuck comprises a chuck body 1 with a chuck surface 16 and a chuck plate 28 which rests on the chuck surface 16 over its entire area and can be released from the chuck body. Thus, the releasable chuck plate 28 can be removed from the vacuum chamber in order for the test substrate to be mounted on the chuck. The chuck plate 28 can be connected to the chuck body 1 in the same way as that described above, via the thermally decoupling holding pins and heads. In such an arrangement, the corresponding holding means would be located on the chuck plate 28 rather than the test substrate 12.

While there have been described what are believed to be the preferred embodiments of the invention, those skilled in the art will recognize that other and further changes and modifications may be made thereto without departing from the spirit of the invention, and it is intended to claim all such changes and modifications as fall within the true scope of the invention.

We claim:

1. A test apparatus for testing substrates at low temperatures, comprising:
   a vacuum chamber;
   an uncooled chuck drive arranged within said vacuum chamber;
   a chuck carried by said chuck drive and thermally decoupled therefrom, said chuck having a receiving surface for receiving a test substrate;
   a substrate carrier for receiving and holding a substrate to be tested in releasable thermal contact with said receiving surface; and
   a directly cooled thermal radiation shield arranged to shield said test substrate from thermal radiation,
   wherein said thermal radiation shield has a through-opening in the center and the through-opening is provided with a transparent closure which filters light of selected wavelengths.

2. The test apparatus as claimed in claim 1 wherein said vacuum chamber is provided with an inspection opening on top wall lying opposite a top side of said chuck.

3. The test apparatus as claimed in claim 1 wherein said chuck is connected to said chuck drive by means of an intermediate part made from a material with a lower thermal conductivity than metal.

4. The test apparatus as claimed in claim 1 wherein there are provided probe holders which are thermally conductively connected to the chuck.

5. A test apparatus for testing substrates at low temperatures, comprising:
   a vacuum chamber;
   an uncooled chuck drive arranged within said vacuum chamber;
   a chuck carried by said chuck drive and thermally decoupled therefrom, said chuck having a receiving surface for receiving a test substrate;
   a substrate carrier for receiving and holding a substrate to be tested in releasable thermal contact with said receiving surface;
   a directly cooled thermal radiation shield arranged to shield said test substrate from thermal radiation; and
   probe holders which are thermally conductively connected to the thermal radiation shield.

6. The test apparatus as claimed in claim 1 wherein said substrate carrier is carried by a mounting arrangement which includes a vertically movable member which is thermally connected to the cooled chuck, and a holding pin, which is mounted to the chuck drive and consists of a material with a lower thermal conductivity than metal.

7. The test apparatus as claimed in claim 1 wherein the chuck comprises a chuck body with a chuck surface and a chuck plate which rests on the chuck surface over its entire area and can be detached from the chuck body.

8. The test apparatus as claimed in claim 1 wherein cooled parts of the chuck and of the thermal radiation shield consist of material with a good thermal conductivity, and the cooled parts of the chuck have highly reflective surfaces.

9. The test apparatus as claimed in claim 1 wherein the chuck has a chuck heater.

10. The test apparatus as claimed in claim 1 wherein the thermal radiation shield has a shield heater.

* * * * *